(12) United States Patent
Shin et al.

(10) Patent No.: US 11,245,092 B2
(45) Date of Patent: Feb. 8, 2022

(54) DISPLAY DEVICE

(71) Applicant: Samsung Display Co., Ltd., Yongin-Si (KR)

(72) Inventors: Jaiku Shin, Hwaseong-si (KR); Hansun Ryou, Seoul (KR); Dongjin Park, Seongnam-si (KR); Dongwoo Seo, Suwon-si (KR); Sungchul Choi, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/706,916

(22) Filed: Dec. 9, 2019

(65) Prior Publication Data
US 2020/0259115 A1    Aug. 13, 2020

(30) Foreign Application Priority Data

Feb. 8, 2019   (KR) .................. 10-2019-0014980

(51) Int. Cl.
| | |
|---|---|
| *H01L 51/52* | (2006.01) |
| *H05K 5/00* | (2006.01) |
| *H01L 51/00* | (2006.01) |
| *H01L 27/32* | (2006.01) |
| *G09G 3/3266* | (2016.01) |
| *G09G 3/3275* | (2016.01) |

(52) U.S. Cl.
CPC ...... *H01L 51/5246* (2013.01); *H01L 27/3244* (2013.01); *H01L 51/0097* (2013.01); *H01L 51/5253* (2013.01); *H05K 5/0017* (2013.01); *G09G 3/3266* (2013.01); *G09G 3/3275* (2013.01); *H01L 2251/5338* (2013.01)

(58) Field of Classification Search
CPC ............. H01L 51/5246; H01L 51/5253; H01L 51/0097; H01L 27/3244; H01L 2251/5338; H05K 5/0017; G09G 3/3266; G09G 3/3275
See application file for complete search history.

(56) References Cited

U.S. PATENT DOCUMENTS 10,520,983 B2 *  12/2019  Kwon .................. G06F 1/1615
10,678,299 B2 *   6/2020  Jung .................... G06F 1/1641
(Continued)

FOREIGN PATENT DOCUMENTS

| KR | 1020160089583 A | 7/2016 |
| KR | 1020180036323 A | 4/2018 |
| KR | 1020180114565 A | 10/2018 |

*Primary Examiner* — Abhishek M Rathod
(74) *Attorney, Agent, or Firm* — Cantor Colburn LLP

(57) ABSTRACT

A display device includes a display module including in order along a first direction: a first non-folding area, a folding area at which the display device is foldable, and a second non-folding area, a first supporter on which the first non-folding area is disposed, a second supporter on which the second non-folding area is disposed, a first adhesive between the first non-folding area and the first supporter, and a second adhesive between the second non-folding area and the second supporter. Within the folding area, a first distance along the first direction between, the first adhesive and the second adhesive, is both: greater than a second distance along the first direction, between the first supporter and the second supporter, and smaller than a length of the folding area, along the first direction.

19 Claims, 16 Drawing Sheets

(56) References Cited

U.S. PATENT DOCUMENTS

| | | | |
|---|---|---|---|
| 2016/0209874 A1* | 7/2016 | Choi | H05K 1/028 |
| 2018/0295735 A1 | 10/2018 | Ahn | |
| 2018/0343756 A1* | 11/2018 | Lin | B32B 3/26 |
| 2019/0305238 A1 | 10/2019 | Shin et al. | |
| 2020/0022267 A1* | 1/2020 | Han | H05K 5/03 |
| 2020/0119290 A1* | 4/2020 | Shin | G06F 1/1652 |
| 2020/0204666 A1* | 6/2020 | Hong | G06F 1/1616 |
| 2020/0209998 A1* | 7/2020 | Shin | G06F 1/1641 |

* cited by examiner

DISPLAY DEVICE

This application claims priority to Korean Patent Application No. 10-2019-0014980, filed on Feb. 8, 2019, and all the benefits accruing therefrom under 35 U.S.C. § 119, the contents of which are hereby incorporated by reference in its entirety.

BACKGROUND

1. Field

The present disclosure relates to a display device. More particularly, the present disclosure relates to a display device capable of preventing deformation of a folding portion thereof.

2. Description of the Related Art

Electronic devices that provide a user with an image, such as a smart phone, a digital camera, a notebook computer, a navigation unit and a smart television, include a display device to display the image. The display device generates the image and provides the image to the user through a display screen thereof.

With the technological development for the display device, various types of display devices have been developed. For example, various flexible display devices, which are capable of being transformed into a curved shape, foldable, or rollable, are being developed. The flexible display device, which is capable of being transformed into various shapes, is easy to carry and improves a user's convenience.

SUMMARY

The present disclosure provides a display device capable of reducing or effectively preventing deformation a folding portion thereof.

Embodiments provide a display device including a display module including in order along a first direction: a first non-folding area, a folding area at which the display device is foldable, and a second non-folding area, a first supporter on which the first non-folding area is disposed, a second supporter on which the second non-folding area is disposed, a first adhesive between the first non-folding area and the first supporter, and a second adhesive between the second non-folding area and the second supporter. Within the folding area, a first distance along the first direction, between the first adhesive and the second adhesive, is greater than both: a second distance along the first direction, between the first supporter and the second supporter, and smaller than a length of the folding area, along the first direction.

Embodiments provide a display device including a display module including a folding area, a first supporter and a second supporter on which the display module is disposed and arranged spaced apart from each other along a first direction, a first adhesive between the display module and the first supporter, and a second adhesive between the display module and the second supporter. Within the folding area, a length of the first adhesive which is taken along the first direction and a length of the second adhesive which is taken along the first direction, are both smaller than a length of the first supporter which is taken along the first direction and a length of the second supporter which is taken along the first direction.

Embodiments provide a display device including a display module including a folding area, a first supporter and a second supporter on which is disposed the display module and arranged spaced apart from each other along a first direction, a first adhesive between the display module and the first supporter, a second adhesive between the display module and the second supporter, a coating layer between the first adhesive and the first supporter and between the second adhesive and the second supporter, in the folding area, the coating layer detachable from each of the first adhesive and the second adhesive, and a plurality of particles between the coating layer and each of the first adhesive and the second adhesive, respectively, with which the coating layer is detachable from each of the first adhesive and the second adhesive. Within the folding area, a first distance along the first direction, between the first adhesive and the second adhesive, is greater than both: a second distance along the first direction, between the first supporter and the second supporter, and smaller than a length of the folding area, along the first direction, and the display device which is folded at the folding area disposes, at the folding area: the particles attached to the first and second adhesives, and the coating layer together with the first supporter and the second supporter, detached from each of the particles, the first adhesive, the second adhesive and the display module.

According to one or more embodiment, the adhesive disposed under the display module is disposed in the predetermined portions under the folding area to support the display module at the folding area. Thus, deformation of the display module at the folding area, even when the display device is folded at the folding area, may be reduced or effectively prevented.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
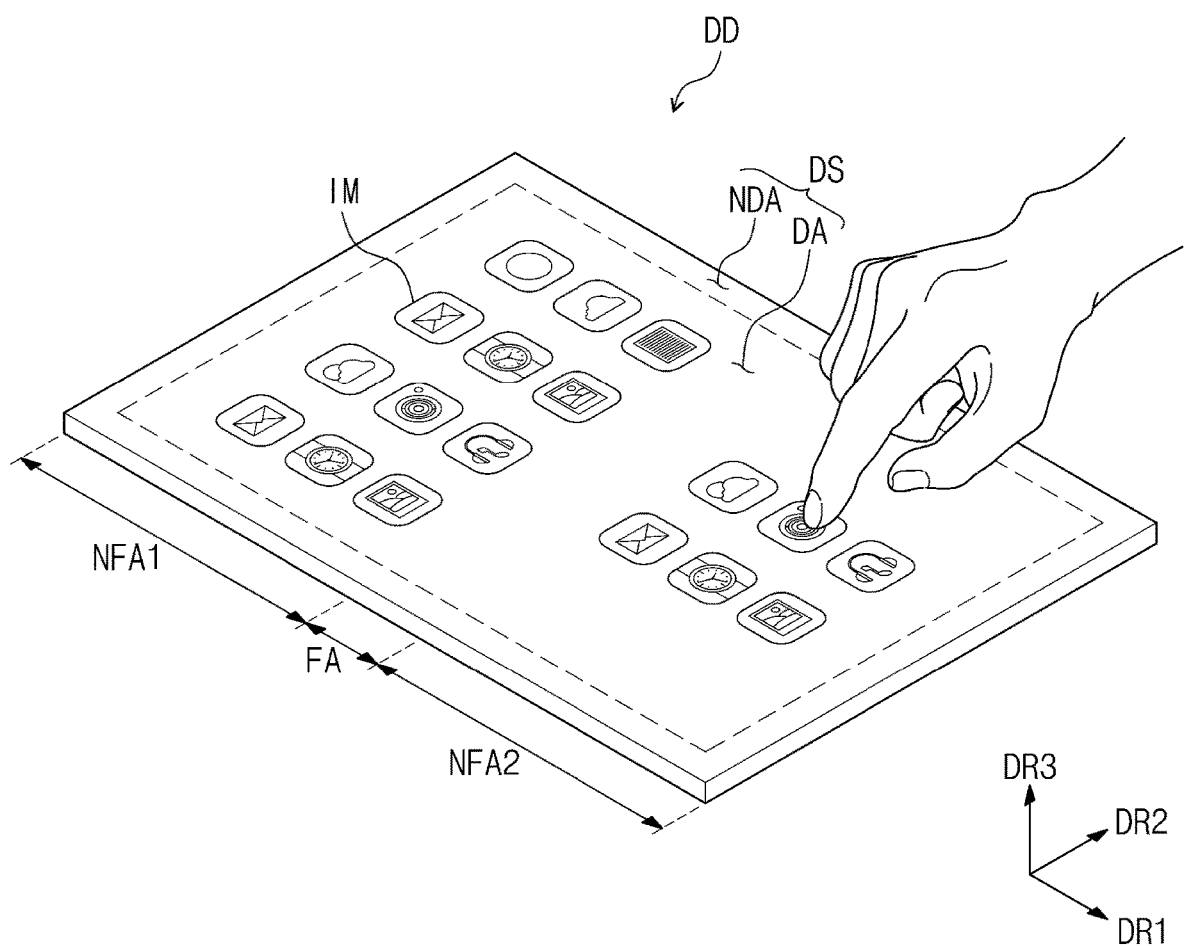
FIG. 1 is a perspective view of an embodiment of a display device.

It will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "directly on," "directly connected to" or "directly coupled to" another element or layer, no intervening elements or layers are present.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, the singular forms, "a," "an" and "the" are intended to include the plural forms as well, unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising" or "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Among flexible display devices, a foldable display device is folded about a folding axis, which extends in one direction. However, the foldable display device has previously unforeseen problems, such as deformation of the folding portion and damage of elements of the folding portion. As such, a foldable display device having improved resistance against deformation and damage is desired.

Hereinafter, the present invention will be explained in detail with reference to the accompanying drawings.

Figure 2:
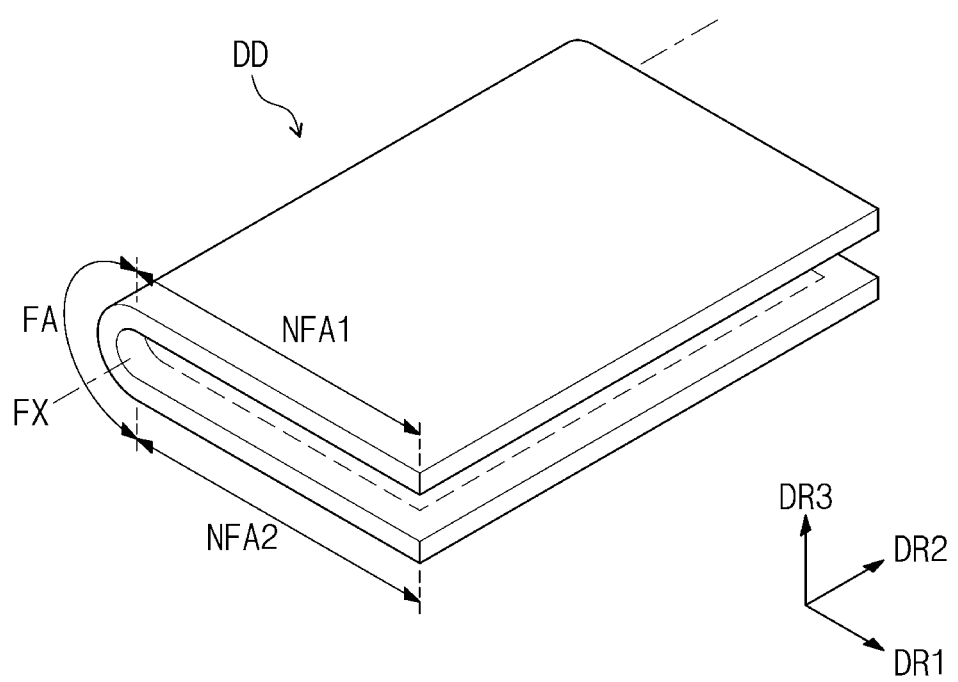
FIG. 2 is a perspective view of an embodiment of the display device shown in FIG. 1, which is folded.

FIG. 1 is a perspective view of an embodiment of a display device DD, which is flat (e.g., unfolded). FIG. 2 is a perspective view of an embodiment of the display device DD shown in FIG. 1, which is folded.

Referring to FIG. 1, the display device DD which is flat, may have a rectangular shape defined by relatively long sides extending along a first direction DR1 and relatively short sides extending along a second direction DR2 which crosses the first direction DR1. However, the shape of the display device DD should not be limited to the rectangular shape, and the display device DD which is flat may have various shapes, such as a circular shape or a polygonal shape.

Hereinafter, a direction substantially perpendicular to a surface or plane defined by the first direction DR1 and the second direction DR2 may be referred to as a third direction DR3. In the present disclosure, the expression "when viewed in a plan view" may mean a state of being viewed along the third direction DR3. In addition, the expression "an area on a plan view" may mean an area of the plane surface defined by the first and second directions DR1 and DR2 when viewed along the third direction DR3.

The display device DD may include a first non-folding area NFA1, a second non-folding area NFA2, and a folding area FA disposed between the first non-folding area NFA1 and the second non-folding area NFA2. The first non-folding area NFA1, the second non-folding area NFA2, and the folding area FA may be arranged along the first direction DR1. The display device DD and components thereof, may be bendable or foldable at the folding area FA, and may not be bendable or foldable at the first non-folding area NFA1 and the second non-folding area NFA2.

In the embodiment, one of the folding area FA and multiple non-folding areas (e.g., two non-folding areas NFA1 and NFA2) are shown as a representative example. However, the number of the folding area FA and the number of a non-folding area should not be limited thereto or thereby. In an embodiment, for example, the display device DD may include more than the two non-folding areas NFA1 and NFA2, and a plurality of folding areas disposed respectively between adjacent non-folding areas.

An upper surface of the display device DD may be referred to as a display surface DS and may be a plane surface defined by the first direction DR1 and the second direction DR2 crossing each other. An image IM generated by the display device DD may be provided in plurality (e.g., images IM) to a user through the display surface DS.

The display surface DS may include a display area DA and a non-display area NDA which is around the display area DA. An image IM is displayed at the display area DA, and an image IM is not displayed at the non-display area NDA. The non-display area NDA is adjacent to the display area DA. In an embodiment, the non-display area NDA surrounds the display area DA and defines an edge of the display device DD. The non-display area NDA may be defined by an area of the display device DD at which a predetermined color is applied such as by printing.

Referring to FIG. 2, the display device DD may be, but not limited to, a foldable display device DD that is foldable and/or unfoldable. The folding area FA may be folded about a folding axis FX substantially parallel to the second direction DR2, and thus the display device DD may be folded at the folding area FA. The folding axis FX may be defined as a relatively short axis substantially parallel to the short sides of the display device DD.

When the display device DD is folded, the display device DD may be inwardly folded (e.g., in-folding) such that the display surface DS at the first non-folding area NFA1 and at the second non-folding area NFA2 face each other and the display surface DS is not exposed for viewing the image IM to outside.

Figure 3:
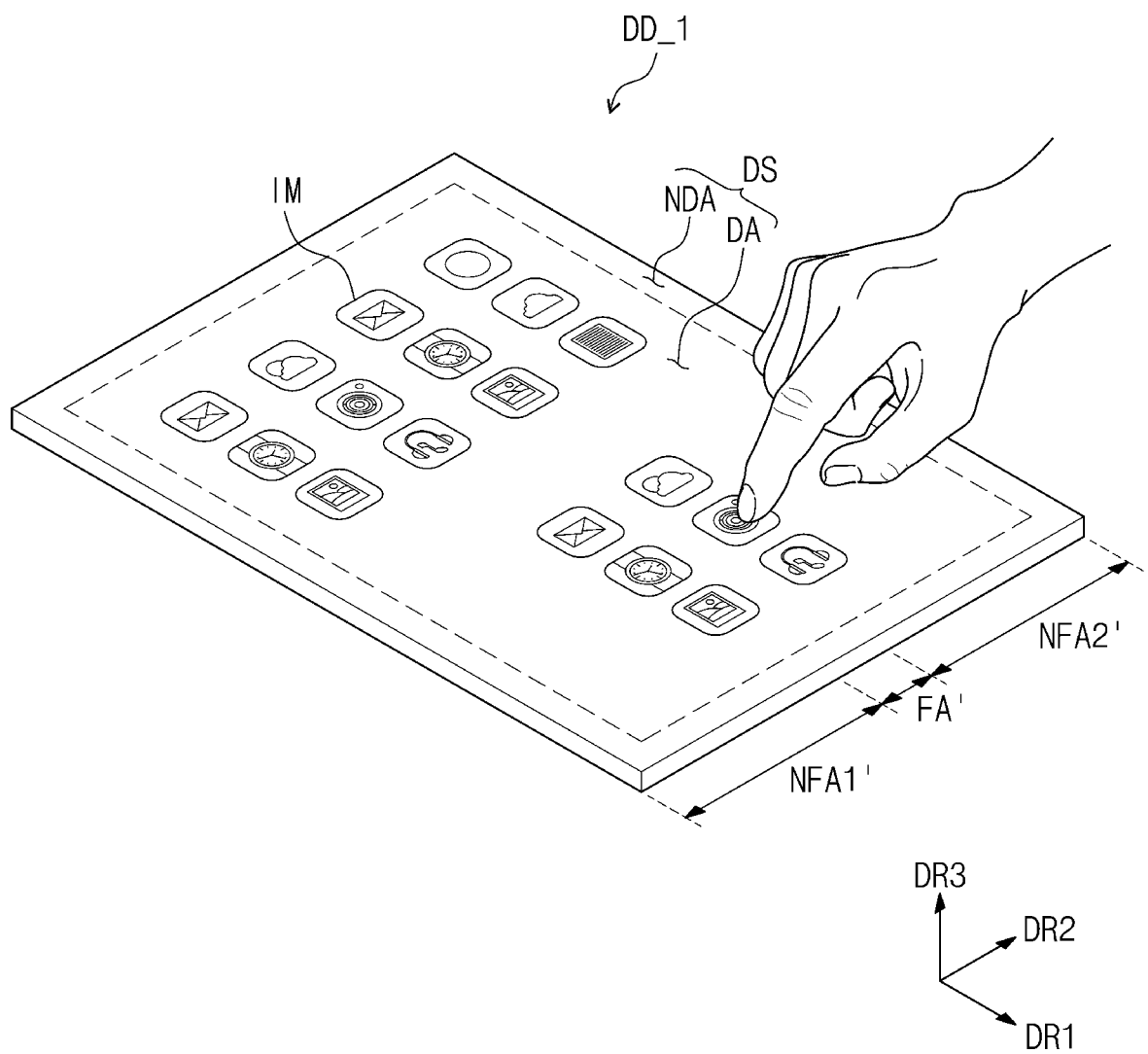
FIG. 3 is a perspective view of another embodiment of a display device.
Figure 4:
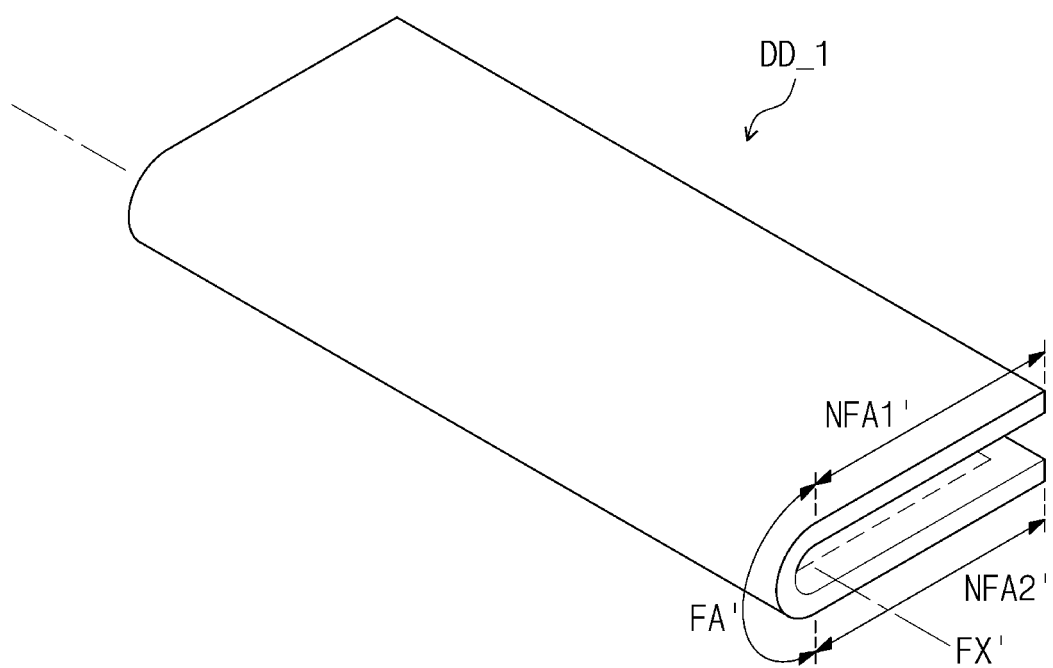
FIG. 4 is a perspective view of the display device shown in FIG. 3, which is folded.
Figure 4:
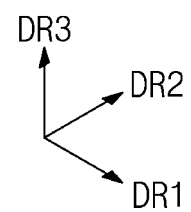

FIG. 3 is a perspective view of another embodiment of a display device DD_1, which is flat. FIG. 4 is a perspective view of the display device DD_1 shown in FIG. 3, which is folded.

The display device DD_1 shown in FIG. 3 may have the same configurations as those of the display device DD shown in FIG. 1 except for a folding operation. Accordingly, the folding operation of the display device DD_1 will be mainly described.

Referring to FIGS. 3 and 4, the display device DD_1 may include a first non-folding area NFA1', a second non-folding area NFA2', and a folding area FA' disposed between the first non-folding area NFA1' and the second non-folding area NFA2'. The first non-folding area NFA1', the second non-folding area NFA2', and the folding area FA' may be arranged along the second direction DR2.

The folding area FA' is folded about a folding axis FX' substantially parallel to the first direction DR1, and thus the display device DD_1 is foldable at the folding area FA'. The folding axis FX' may be defined as a relatively long axis substantially parallel to the relatively long sides of the display device DD_1. The display device DD shown in FIG. 1 may be folded about the relatively short axis, and the display device DD_1 shown in FIG. 3 may be folded about the relatively long axis. The display device DD_1 may be inwardly folded (e.g., in-folding) such that portions of the display surface DS face each other and are not exposed to be viewable from the outside.

Hereinafter, the structure of the display device DD folded about the relatively short axis will be described, however, structures described hereinafter may be applied to the display device DD_1 folded about the relatively long axis.

Figure 5:
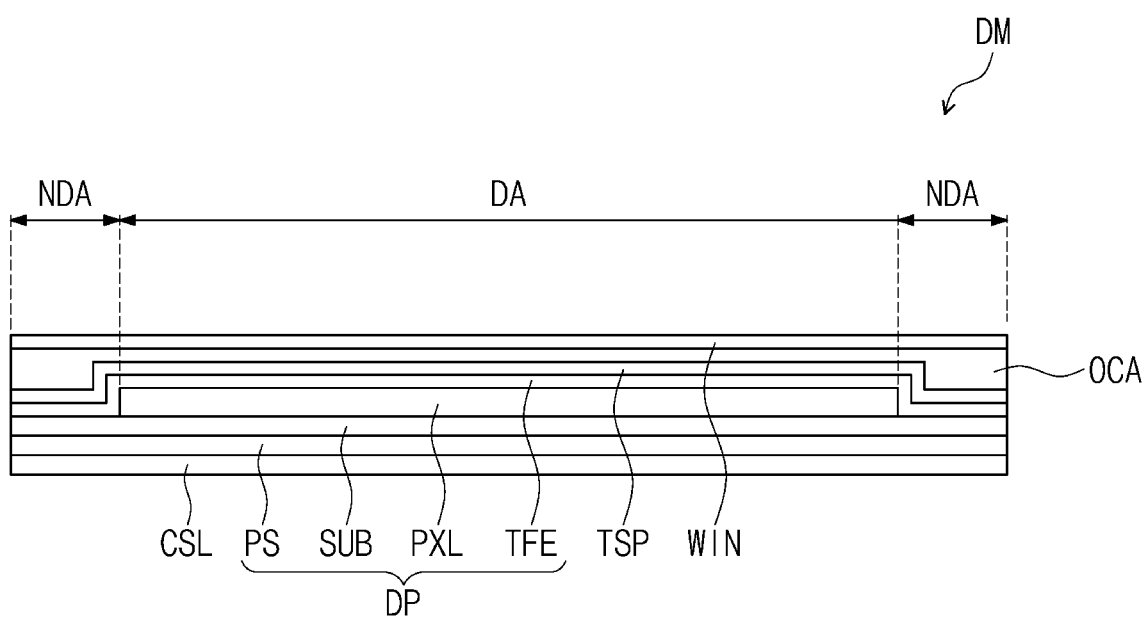
FIG. 5 is a cross-sectional view of an embodiment of a display module of a display device.

FIG. 5 is a cross-sectional view of an embodiment of a display module DM of a display device DD.

Referring to FIG. 5, the display module DM may include a display panel DP, a touch sensing part TSP disposed on the display panel DP, a window WIN disposed on the touch sensing part TSP, an adhesive OCA disposed between the touch sensing part TSP and the window WIN, and a cushion layer CSL disposed under the display panel DP.

The display panel DP may be a light emitting type display panel DP, but should not be particularly limited thereto. In an embodiment, for instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The display panel DP may include a substrate SUB, a pixel layer PXL disposed on the substrate SUB, a thin film encapsulation layer TFE disposed on the substrate SUB to cover the pixel layer PXL, and a protective substrate PS disposed under the substrate SUB. The substrate SUB may include a flexible plastic substrate that is transparent. As an example, the substrate SUB may include polyimide ("PI").

The substrate SUB may include a display area DA and a non-display area NDA which is adjacent to the display area DA. The display area DA and the non-display area NDA of the display module DM may correspond to those areas of one or more embodiment of a display device DD. The display module DM may define the display surface DS of the display device DD, such as at the window WIN. The pixel layer PXL may be disposed on the display area DA. The pixel layer PXL may include a plurality of pixels, and each of the pixels may include a light emitting device. The pixel layer PXL may be controlled to generate and/or emit light to display an image IM.

The thin film encapsulation layer TFE may include at least two inorganic layers and an organic layer which is disposed between the inorganic layers. The inorganic layers may include an inorganic material and may protect the pixel layer PXL from moisture and oxygen. The organic layer may include an organic material and may protect the pixel layer PXL from a foreign substance such as dust particles.

The protective substrate PS may protect a lower portion of the substrate SUB. The protective substrate PS may include a flexible plastic substrate. As an example, the protective substrate PS may include polyethylene terephthalate ("PET").

The touch sensing part TSP may sense an external input to the display module DM by an input device, such as a user's finger or a touch pen, may convert the sensed input to a predetermined input signal, and may provide the display panel DP with the input signal. The touch sensing part TSP may include a plurality of touch sensor units (not shown) to sense the external input. The touch sensor units may sense the external input by a capacitive method. The display panel DP may receive the input signal from the touch sensing part TSP and may generate an image IM corresponding to the input signal.

The window WIN may protect the display panel DP and the touch sensing part TSP from external scratches and impacts. The window WIN may be attached to the touch sensing part TSP by the adhesive OCA. The adhesive OCA may include an optically clear adhesive. The image generated by the display panel DP may be provided to the user which is outside the display module DM, after passing through the window WIN.

The cushion layer CSL may absorb external impacts applied to the lower portion of the display module DM to protect the display panel DP. The cushion layer CSL may include a foam sheet having a predetermined elasticity.

Figure 6:
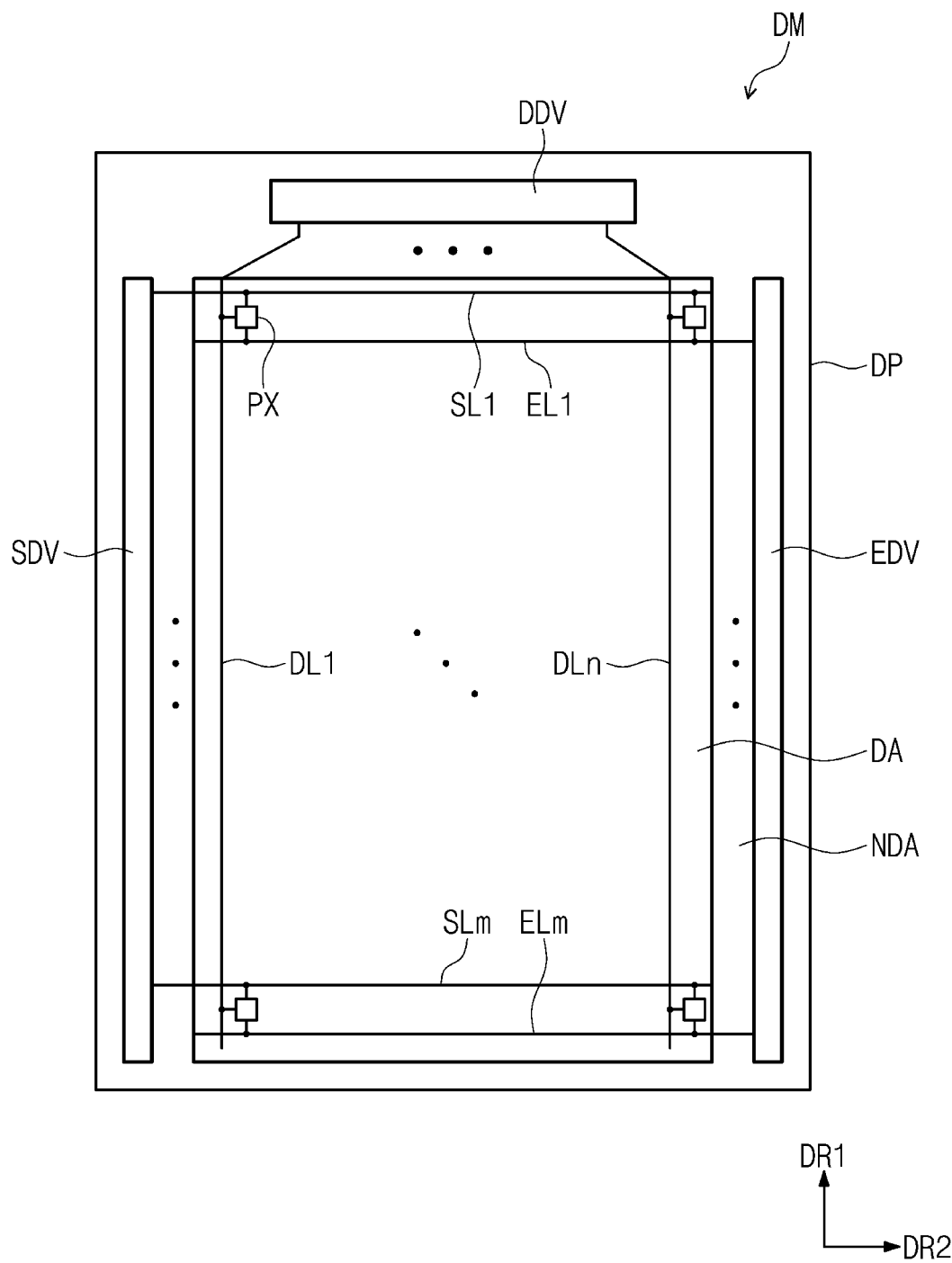
FIG. 6 is an embodiment of a plan view of the display module shown in FIG. 5.

FIG. 6 is an embodiment of a plan view of the display module DM shown in FIG. 5.

Referring to FIG. 6, the display module DM may include the display panel DP, a scan driver SDV, a data driver DDV, and an emission driver EDV FIG. 6 shows a configuration of the display panel DP when viewed in a plan view, and the planar configuration of the touch sensing part is omitted for convenience of illustration.

The display panel DP may be a flexible display panel. In an embodiment, for example, the display panel DP may include a plurality of electronic elements disposed on a flexible substrate. The display panel DP may have a rectangular shape defined by relatively long sides extending along the first direction DR1 and relatively short sides extending along the second direction DR2. The display panel DP may include a display area DA and a non-display area NDA which is adjacent to the display area DA. The display area DA and the non-display area NDA of the display module DM may correspond to those areas of one or more embodiment of a display device DD. The display module DM may define the display surface DS of the display device DD.

The display panel DP may include a pixel PX provided in plurality (hereinafter "pixels PX"), a plurality of scan lines SL1 to SLm, a plurality of data lines DL1 to DLn, and a plurality of light emitting lines EL1 to ELm. Each of "m" and "n" is a natural number. The pixels PX may be arranged in a matrix form, however, should not be limited thereto or thereby. The pixels PX may be arranged in the display area DA and may be connected to corresponding signal lines among the scan lines SL1 to SLM, the data lines DL1 to DLn, and the light emitting lines EL1 to ELm.

The scan driver SDV, the data driver DDV, and the emission driver EDV may be arranged in the non-display area NDA. The scan driver SDV and the emission driver EDV may be disposed to be respectively adjacent to the relatively long sides of the display panel DP. The data driver DDV may be manufactured in an integrated circuit chip form and may be disposed to be adjacent to one relatively short side among the relatively short sides of the display panel DP.

The scan lines SL1 to SLm may lengthwise extend along the second direction DR2 and may be connected to the scan driver SDV. The data lines DL1 to DLn may lengthwise extend along the first direction DR1 and may be connected to the data driver DDV. The light emitting lines EL1 to ELm may lengthwise extend along the second direction DR2 and may be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages as data signals, and the data voltages may be applied to the pixels PX through the data lines DL1 to DLn. The emission driver EDV may generate a plurality of light emitting signals, and the light emitting signals may be applied to the pixels PX through the light emitting lines EL1 to ELm. The various signals may drive or control the pixels PX and components therein to generate light and/or display an image IM. The pixels PX may be units of the display module DM at which light is emitted and/or the image IM is displayed.

Although not shown in figures, the display module DM may include a timing controller (not shown) to control an operation of the scan driver SDV, the data driver DDV, and the emission driver EDV The timing controller may generate a scan control signal, a data control signal, and a light emitting control signal in response to control signals applied thereto from outside the display module DM. The timing controller may receive image signals from outside the display module DM, may convert a data format of the image signals according to an interface with the data driver DDV, and may provide the converted image signals to the data driver DDV.

The scan driver SDV may generate the scan signals in response to the scan control signal, and the emission driver EDV may generate the light emitting signals in response to the light emitting control signal. The data driver DDV may receive the image signals whose data format is converted and may generate data voltages corresponding to the image signals in response to the data control signal.

The pixels PX may receive the data voltages in response to the scan signals. The pixels PX may emit light having luminance corresponding to the data voltages in response to the light emitting signals to display the image. A light emitting time of the pixels PX may be controlled by the light emitting signals.

Figure 7:
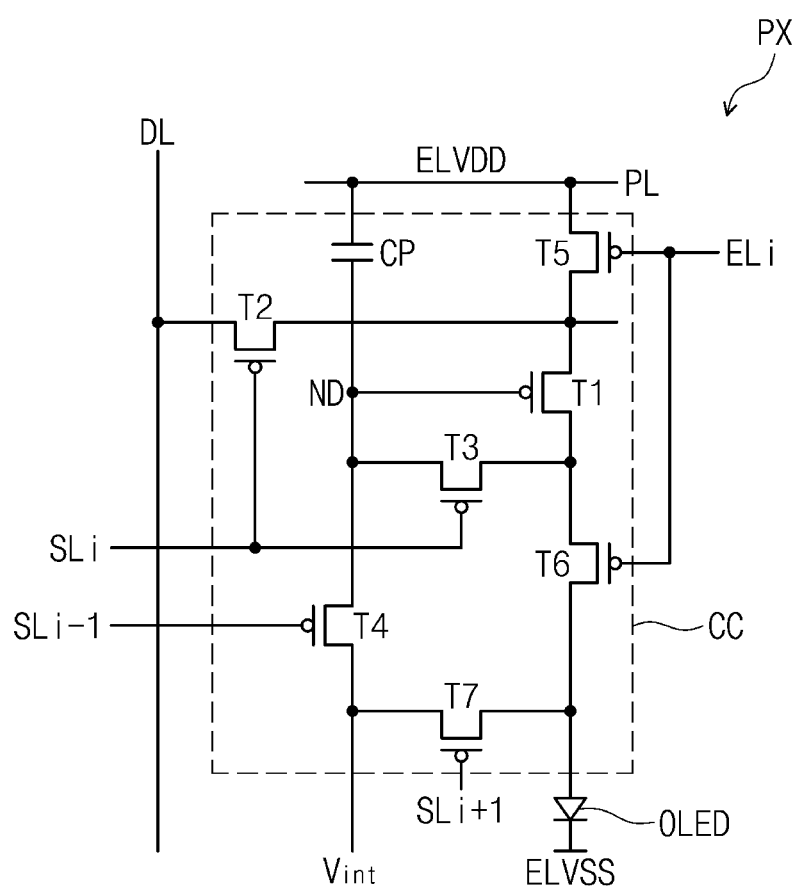
FIG. 7 is an equivalent circuit diagram of an embodiment of a pixel in the display module shown in FIG. 6.

FIG. 7 is an equivalent circuit diagram of an embodiment of the pixel PX shown in FIG. 6.

Referring to FIG. 7, the pixel PX may include an organic light emitting device OLED and a pixel circuit CC. The pixel PX may be controlled via elements of the pixel circuit CC, to generate and/or emit light. The pixel circuit CC may include a plurality of transistors T1 to T7 and a capacitor CP. The pixel circuit CC may control an amount of electrical current flowing through the organic light emitting device OLED in response to the data voltage.

The organic light emitting device OLED may emit a light at a predetermined luminance in response to the amount of electrical current provided from the pixel circuit CC. To this end, a level of a first voltage ELVDD may be set higher than a level of a second voltage ELVSS.

Each of the transistors T1 to T7 may include an input electrode (or source electrode), an output electrode (or drain electrode), and a control electrode (or gate electrode). In the following descriptions, for the convenience of explanation, one electrode among the input electrode and the output electrode may be referred to as a "first electrode," and the other electrode among the input electrode and the output electrode may be referred to as a "second electrode."

A first electrode of a first transistor T1 may be connected to the first voltage ELVDD via a fifth transistor T5, and a second electrode of the first transistor T1 may be connected to an anode electrode of the organic light emitting device OLED via a sixth transistor T6. The first transistor T1 may be referred to as a "driving transistor" in the present disclosure. The first transistor T1 may control the amount of electrical current flowing through the organic light emitting device OLED in response to a voltage applied to a control electrode of the first transistor T1.

A second transistor T2 may be connected between a corresponding data line DL and the first electrode of the first transistor T1, and a control electrode of the second transistor T2 may be connected to an i-th scan line SLi. The second transistor T2 may be turned on when an i-th scan signal is applied to the i-th scan line SLi and may electrically connect the data line DL to the first electrode of the first transistor T1.

A third transistor T3 may be connected between the second electrode of the first transistor T1 and the control electrode of the first transistor T1. A control electrode of the third transistor T3 may be connected to the i-th scan line SLi. The third transistor T3 may be turned on when the i-th scan signal is applied to the i-th scan line SLi and may electrically connect the second electrode of the first transistor T1 to the control electrode of the first transistor T1. When the third transistor T3 is turned on, the first transistor T1 may be connected in a diode configuration.

A fourth transistor T4 may be connected between a node ND and an initialization power generator (not shown). A control electrode of the fourth transistor T4 may be connected to an (i−1)th scan line SLi−1. The fourth transistor T4 may be turned on when an (i−1)th scan signal is applied to the (i−1)th scan line SLi−1 and may provide an initialization voltage Vint to the node ND.

The fifth transistor T5 may be connected between a power line PL and the first electrode of the first transistor T1. A control electrode of the fifth transistor T5 may be connected to an i-th light emitting line ELi.

The sixth transistor T6 is connected between the second electrode of the first transistor T1 and the anode electrode of the organic light emitting device OLED. A control electrode of the sixth transistor T6 may be connected to the i-th light emitting line ELi.

A seventh transistor T7 may be connected between the initialization power generator (not shown) and the anode electrode of the organic light emitting device OLED. A control electrode of the seventh transistor T7 may be connected to an (i+1)th scan line SLi+1. The seventh transistor T7 may be turned on when an (i+1)th scan signal is applied to the (i+1)th scan line SLi+1 and may provide the initialization voltage Vint to the anode electrode of the organic light emitting device OLED.

The capacitor CP may be disposed between the power line PL and the node ND. The capacitor CP may be charged with a voltage corresponding to the data voltage. When the fifth and sixth transistors T5 and T6 are turned on due to the voltage charged in the capacitor CP, the amount of the electrical current flowing through the first transistor T1 may be determined.

FIG. 7 illustrates a PMOS as a reference of the transistors T1 to T7, however, the transistors T1 to T7 should not be limited to the PMOS. According to another embodiment, the transistors T1 to T7 may be implemented by an NMOS.

Figure 8:
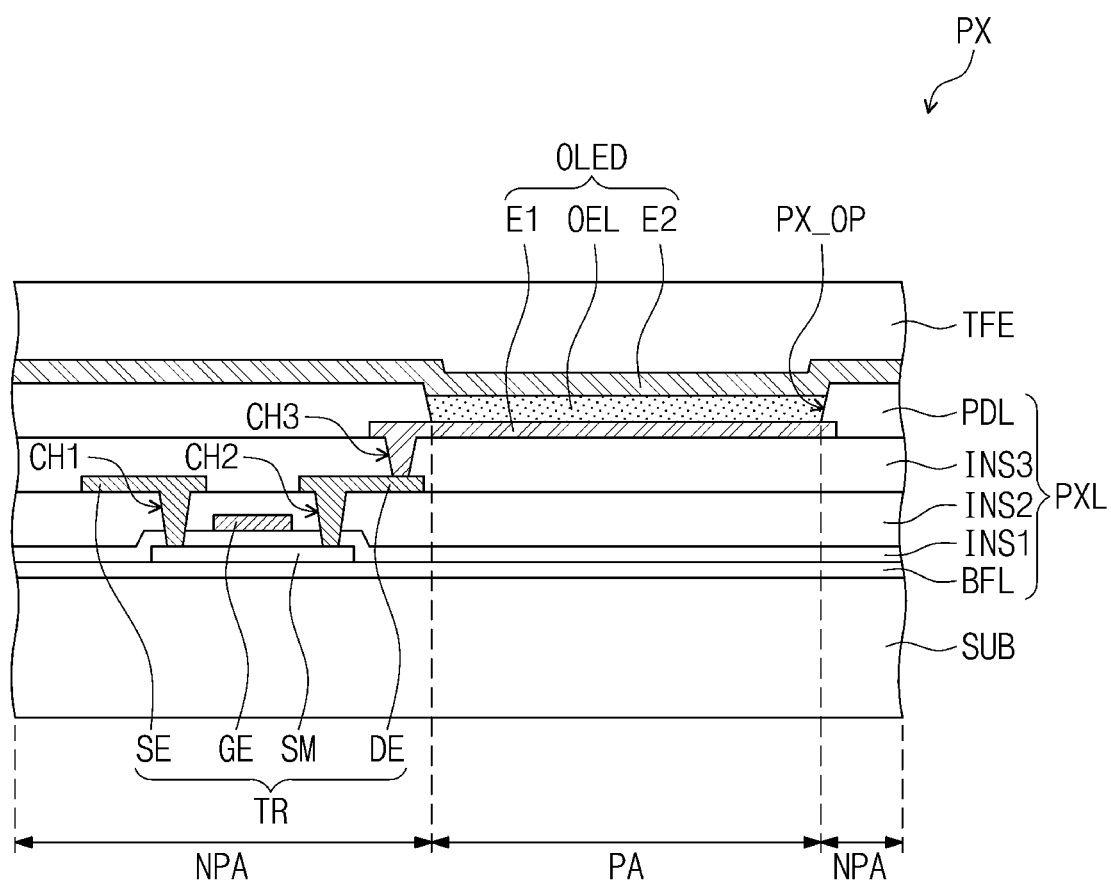
FIG. 8 is a cross-sectional view of an embodiment of a portion of a light emitting device in the pixel shown in FIG. 7.

FIG. 8 is a cross-sectional view of an embodiment of a portion of the light emitting device OLED shown in FIG. 7.

Referring to FIG. 8, the pixel PX may include the organic light emitting device OLED and a transistor TR which is connected to the organic light emitting device OLED. The organic light emitting device OLED may include a first electrode E1, a second electrode E2, and an organic light emitting layer OEL disposed between the first electrode E1 and the second electrode E2. The transistor TR may be the sixth transistor T6 shown in FIG. 7.

The first electrode E1 may be the anode electrode, and the second electrode E2 may be a cathode electrode. The first electrode E1 may be referred to as a "pixel electrode," and the second electrode E2 may be referred to as a "common electrode."

The pixel PX may include a pixel area PA and a non-pixel area NPA which is adjacent to the pixel area PA. The organic light emitting device OLED may be disposed in the pixel area PA, and the transistor TR may be disposed in the non-pixel area NPA. Light may be emitted from the pixel PX at the pixel area PA (e.g., "light emitting area") and light may not be emitted from the pixel PX at the non-pixel area NPA.

The transistor TR and the organic light emitting device OLED may be disposed on the substrate SUB. A buffer layer BFL may be disposed on the substrate SUB, and the buffer layer BFL may include an inorganic material.

A semiconductor layer SM of the transistor TR may be disposed on the buffer layer BFL. The semiconductor layer SM may include an inorganic semiconductor, such as amorphous silicon or polycrystalline silicon, or an organic semiconductor. In addition, the semiconductor layer SM may include an oxide semiconductor. Although not shown in FIG. 8, the semiconductor layer SM may include a source area, a drain area, and a channel area defined between the source area and the drain area.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to overlap with the semiconductor layer SM. The gate electrode GE may be disposed to overlap with the channel area of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source area of the semiconductor layer SM at or through a first contact hole CH1 defined through the first insulating layer INS1 and the second insulating layer INS2. The drain electrode DE may be connected to the drain area of the semiconductor layer SM at or through a second contact hole CH2 defined through the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be referred to as a "planarization layer" that provides a flat upper surface and may include an organic material.

The first electrode E1 may be disposed on the third insulating layer INS3. The first electrode E1 may be connected to the drain electrode DE of the transistor TR at or through a third contact hole CH3 defined through the third insulating layer INS3.

A pixel definition layer PDL may be disposed on the first electrode E1 and the third insulating layer INS3 to expose a predetermined portion of the first electrode E1. An opening PX_OP may be defined through the pixel definition layer PDL to expose the predetermined portion of the first electrode E1.

The organic light emitting layer OEL may be disposed on the first electrode E1 in the opening PX_OP. The organic light emitting layer OEL may generate a light having one of red, green, and blue colors, however, should not be limited thereto or thereby. The organic light emitting layer OEL may generate a white light by a combination of organic materials respectively generating the red, green, and blue colors.

The second electrode E2 may be disposed on the pixel definition layer PDL and the organic light emitting layer OEL. The thin film encapsulation layer TFE may be disposed on the organic light emitting device OLED to cover the pixel PX. One or more of the layers disposed between the substrate SUB and the thin film encapsulation layer TFE in FIG. 8 may be referred to as the pixel layer PXL described above.

The first voltage ELVDD may be applied to the first electrode E1, and the second voltage ELVSS may be applied to the second electrode E2. Holes and electrons injected into the organic light emitting layer OEL are recombined to generate excitons, and the organic light emitting device OLED emits the light by the excitons that return to a ground state from an excited state. The organic light emitting device OLED may emit red, green, and blue lights in accordance with the electrical current flow, so that the image may be displayed.

Figure 9:
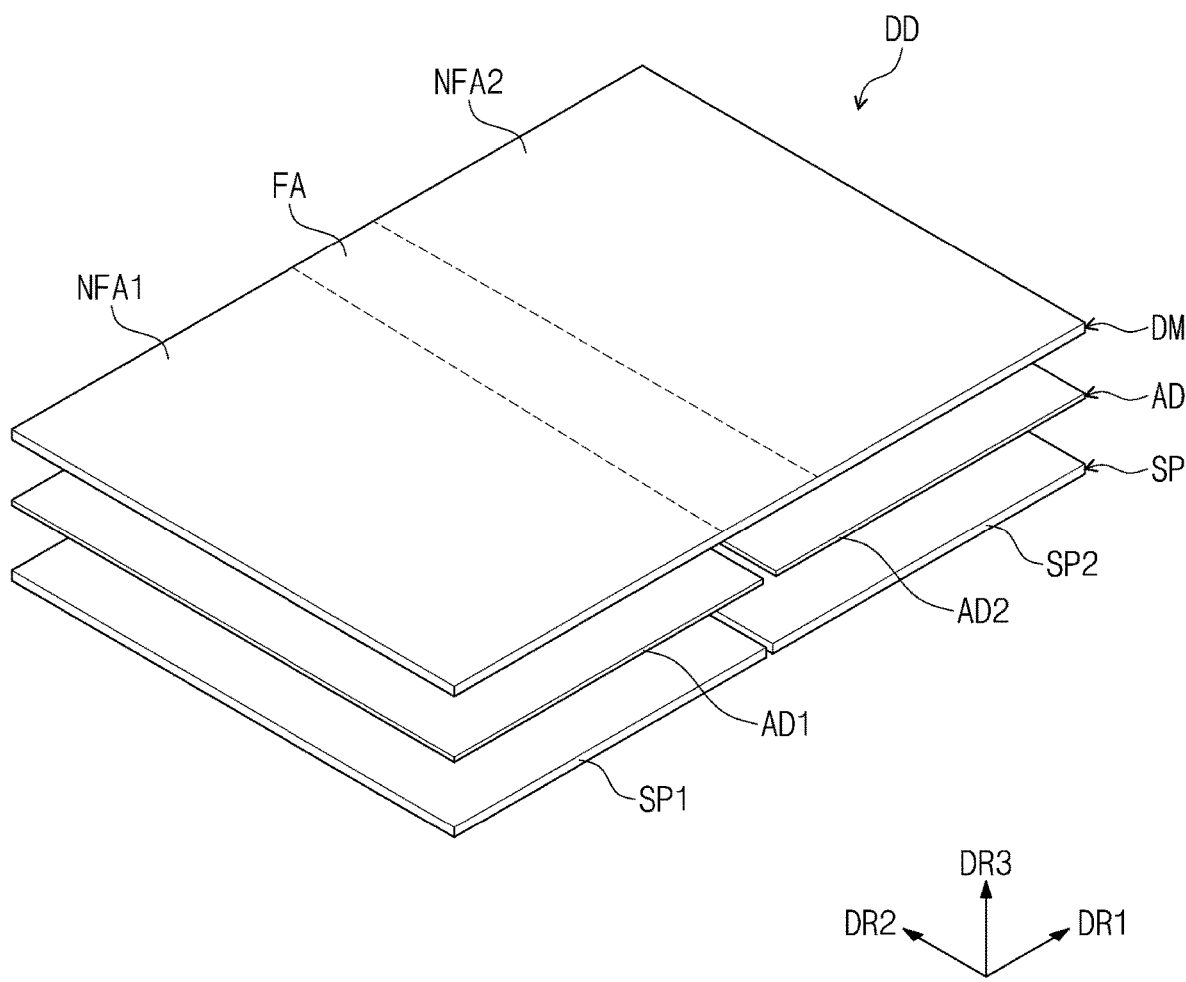
FIG. 9 is an exploded perspective view of an embodiment of a display device.

FIG. 9 is an exploded perspective view of an embodiment of a display device DD.

Referring to FIG. 9, the display device DD may include a display module DM, a supporter SP disposed under the display module DM, and an adhesive layer AD disposed between the display module DM and a supporter SP (or support member). Although not shown in figures, the display device DD may further include a case (or housing) to accommodate therein both of the display module DM and the supporter SP. The display module DM may have a rectangular shape defined by relatively long sides extending along the first direction DR1 and relatively short sides extending along the second direction DR2. The display module DM may include a first non-folding area NFA1, a second non-folding area NFA2, and a folding area FA disposed between the first non-folding area NFA1 and the second non-folding area NFA2. These areas may correspond to a folding area FA disposed between the first non-folding area NFA1 and the second non-folding area NFA2 of the display device DD as described above. The first non-folding area NFA1, the second non-folding area NFA2, and the folding area FA may be arranged along the first direction DR1.

The supporter SP may support thereon the display module DM. The supporter SP may be relatively rigid such that portions of the display module DM are supported, such as to be maintained in a flat shape. In an embodiment, for example, the supporter SP may include a metal material.

The supporter SP may be attached to the display module DM by the adhesive layer AD. The adhesive layer AD may include a pressure sensitive adhesive, as an example. The adhesive layer AD may include various adhesives in addition to the pressure sensitive adhesive.

The supporter SP may include a first supporter SP1 and a second supporter SP2, which are arranged along the first direction DR1. The first supporter SP1 and the second supporter SP2 may be spaced apart from and disconnected from each other along the first direction DR1. The first supporter SP1 may be disposed under and corresponding to the first non-folding area NFA1, and the second supporter SP2 may be disposed under and corresponding to the second non-folding area NFA2. The first supporter SP1 and the second supporter SP2 may be disposed in a plane defined by the first and second directions DR1 and DR2. The first supporter SP1 and the second supporter SP2 may each define a planar surface disposed in the plane defined by the first and second directions DR1 and DR2

The adhesive layer AD may include a first adhesive AD1 (or first adhesive member or first adhesive layer) disposed between the first non-folding area NFA1 and the first supporter SP1 and a second adhesive AD2 (or second adhesive member) disposed between the second non-folding area NFA2 and the second supporter SP2. The first adhesive AD1 and the second adhesive AD2 may be spaced apart from and disconnected from each other along the first direction DR1. The first supporter SP1 may be attached to the first non-folding area NFA1 by the first adhesive AD1. The second supporter SP2 may be attached to the second non-folding area NFA2 by the second adhesive AD2.

Figure 10:
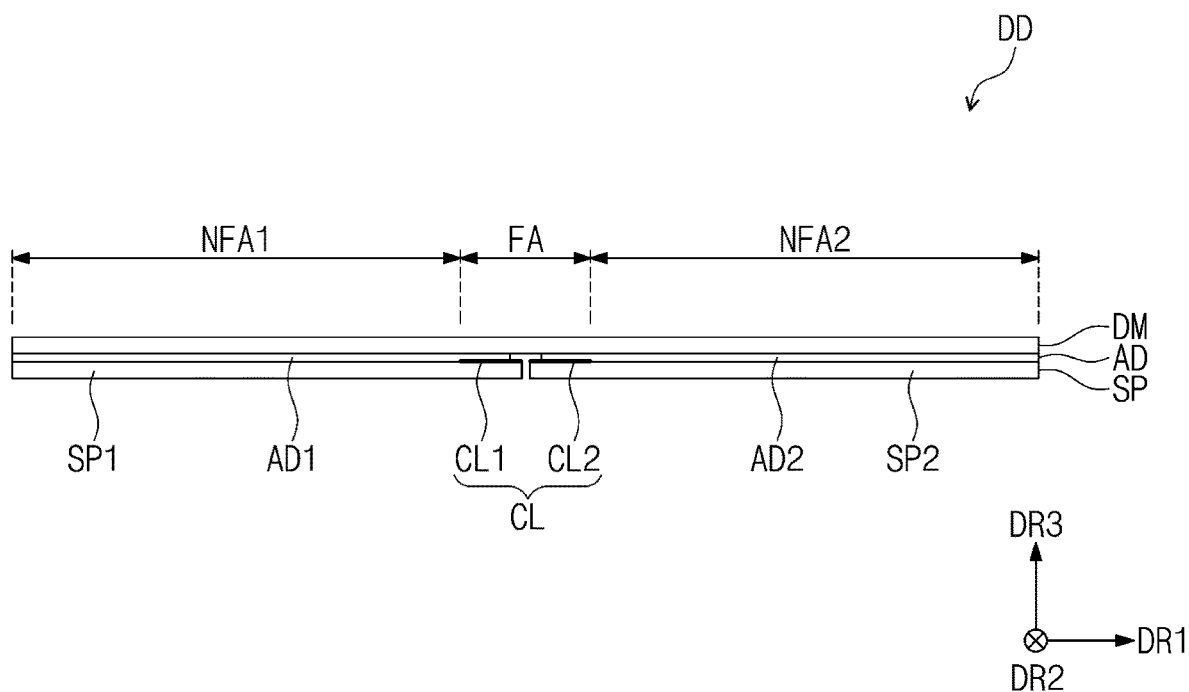
FIG. 10 is a cross-sectional side view of the display device shown in FIG. 9, which is flat.

FIG. 10 is a cross-sectional side view of the display device DD shown in FIG. 9, which is flat.

FIG. 10 shows a side view of the display device DD when viewed along the second direction DR2. For the convenience of explanation, the display module DM and the supporter SP in FIG. 10 are shown attached to one another by the adhesive layer AD.

Referring to FIG. 10, the first adhesive AD1 may overlap with or correspond to the first non-folding area NFA1 and a first portion of the folding area FA which is adjacent to the first non-folding area NFA1. The second adhesive AD2 may overlap with or correspond to the second non-folding area NFA2 and a second portion of the folding area FA which is adjacent to the second non-folding area NFA2. Accordingly, a portion of the first adhesive AD1 and a portion of the second adhesive AD2 may both overlap with a same one of the folding area FA.

The first supporter SP1 may overlap with or correspond to the first non-folding area NFA1 and the first portion of the folding area FA which is adjacent to the first non-folding area NFA1. The second supporter SP2 may overlap with the second non-folding area NFA2 and the second portion of the folding area FA which is adjacent to the second non-folding area NFA2. Accordingly, a portion of the first supporter SP1 and a portion of the second supporter SP2 may overlap with the same one of the folding area FA.

A distance along the first direction DR1 between the first adhesive AD1 and the second adhesive AD2 may be greater than a distance along the first direction DR1 between the first supporter SP1 and the second supporter SP2. Therefore, a respective planar area of each of the first and second supporters SP1 and SP2, which overlaps with the folding area FA in a plan view, may be greater than a respective planar area of each of the first and second adhesives AD1 and AD2, which overlaps with the folding area FA in the plan view. The planar area described above may be defined as a total planar area as a product of dimensions taken along the first direction DR1 and the second direction DR2, at which a respective supporter portion or adhesive portion, overlaps the folding area FA.

The display device DD may include a coating layer CL disposed on a portion of an upper surface of each of the first and second supporters SP1 and SP2 which faces or corresponds to the folding area FA. The coating layer CL may not be disposed on or excluded from a portion of the upper surface of each of the first and second supporters SP1 and SP2 which respectively faces or corresponds to the first and second non-folding areas NFA1 and NFA2. The coating layer CL may be provided on a portion of the upper surface of the first supporter SP1 overlapping with the folding area FA and on a portion of the upper surface of the second supporter SP2 overlapping with the folding area FA, such as by coating a material on the upper surface. The coating layer CL may include fluorine.

The coating layer CL may include a first coating layer CL1 (or first coating layer member) coated on the upper surface of the first supporter SP1 and a second coating layer CL2 (or second coating layer member) coated on the upper surface of the second supporter SP2. A portion of the first coating layer CL1 may be disposed between the first supporter SP1 and the first adhesive AD1, which overlap with each other in the folding area FA. A remaining portion of the first coating layer CL1 may be disposed on a portion of the first supporter SP1 that does not overlap with the first adhesive AD1.

A portion of the second coating layer CL2 may be disposed between the second supporter SP2 and the second adhesive AD2, which overlap with each other in the folding area FA. A remaining portion of the second coating layer CL2 may be disposed on a portion of the second supporter SP2 that does not overlap with the second adhesive AD2.

The first and second coating layers CL1 and CL2 may not be attached to the first and second adhesives AD1 and AD2. That is, the first and second coating layers CL1 and CL2 may be detachable from the first and second adhesives AD1 and AD2. The first and second coating layers CL1 and CL2 may be attached to the first and second supporters SP1 and SP2. That is, the first and second supporters SP1 and SP2 may be detachable together with the first and second coating layers CL1 and CL2, from the first and second adhesives AD1 and AD2, respectively, at the folding area FA. The first and second coating layers CL1 and CL2 may reduce or effectively prevent respective attachment of the first and second supporters SP1 and SP2 to the first and second adhesives AD1 and AD2 at the folding area FA.

Although not shown in figures, metal particles in the form of powder may be arranged on or in the first and second coating layers CL1 and CL2. For the convenience of explanation, the metal particles are not shown in FIG. 10 and will be shown in FIGS. 16 to 18. In addition, the reason why the metal particles are used will be described with reference to FIGS. 16 to 18.

Figure 11:
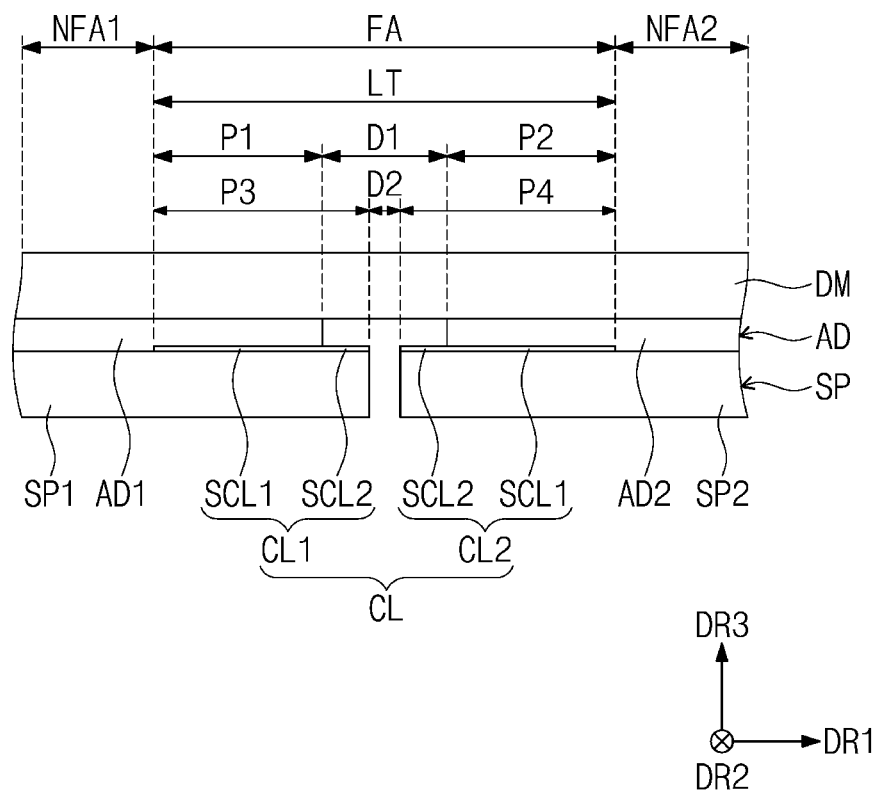
FIG. 11 is an enlarged cross-sectional view of a folding area of a display device shown in FIG. 10, relative to a supporter and an adhesive at the folding area.

FIG. 11 is an enlarged cross-sectional view of the folding area relative to the supporter and the adhesive shown in FIG. 10.

Referring to FIG. 11, one side surface of the first adhesive AD1 and one side surface of the second adhesive AD2, which face each other along the first direction DR1, may correspond to and overlap with the folding area FA. One side surface of the first supporter SP1 and one side surface of the second supporter SP2, which face each other along the first direction DR1, may correspond to overlap with the folding area FA.

A first distance along the first direction DR1 between the first adhesive AD1 and the second adhesive AD2 may be greater than a second distance along the first direction DR1 between the first supporter SP1 and the second supporter SP2. The first distance D1 may be smaller than a length LT of the folding area FA along the first direction DR1. The length LT may be a total length of the folding area FA along the first direction DR1.

The first distance D1 may be defined by a distance between the one side surface of the first adhesive AD1 and the one side surface of the second adhesive AD2. The second distance D2 may be defined by a distance between the one side surface of the first supporter SP1 and the one side surface of the second supporter SP1

The first adhesive AD1 may include a first portion P1 overlapping with the folding area FA, and the second adhesive AD2 may include a second portion P2 overlapping with the folding area FA. A length of the first portion P1 along the first direction DR1 may be equal to a length of the second portion P2 along the first direction DR1. Accordingly, a planar area of the first portion P1 in a plan view may be equal to a planar area of the second portion P2 in a plan view. The planar areas may be respective products of the lengths of the first portion P1 and the second portion P2 along the first direction DR1, and lengths of the first portion P1 and the second portion P2 along the second direction DR2.

However, these are merely embodiments, and the length of the first portion P1 along the first direction DR1 may be different from the length of the second portion P2 along the first direction DR1. In an embodiment, for example, the planar area of the first portion P1 in a plan view may be different from the planar area of the second portion P2 in a plan view.

The first supporter SP1 may include a third portion P3 overlapping with the folding area FA, and the second supporter SP2 may include a fourth portion P4 overlapping with the folding area FA. A length of the third portion P3 along the first direction DR1 may be equal to a length of the fourth portion P4 along the first direction DR1. Accordingly, a planar area of the third portion P3 in a plan view may be equal to a planar area of the fourth portion P4 in a plan view. The planar areas may be respective products of the lengths of the third portion P3 and the fourth portion P4 along the first direction DR1, and lengths of the third portion P3 and the fourth portion P4 along the second direction DR2.

However, these are merely embodiments, and the length of the third portion P3 along the first direction DR1 may be different from the length of the fourth portion P4 along the first direction DR1. Accordingly, the planar area of the third portion P3 in a plan view may be different from the planar area of the fourth portion P4 in a plan view.

The lengths of the adhesive layer AD at each of the first and second portions P1 and P2, which are taken along the first direction DR1, may be smaller than each of the lengths of the supporter SP at each of the third and fourth portions P3 and P4, which are taken along the first direction DR1.

The first and second coating layers CL1 and CL2 may be respectively disposed on and respectively corresponding to the third and fourth portions P3 and P4. Each of the first and second coating layers CL1 and CL2 may include a first sub-coating layer SCL1 corresponding to and overlapping with each of the first and second adhesives AD1 and AD2 and a second sub-coating layer SCL2 not overlapping with each of the first and second adhesives AD1 and AD2 (e.g., corresponding to the first supporter SP1 and the second supporter SP2 in the folding area FA). Ends or boundaries of the folding area FA, may correspond to opposing end surfaces of the adhesive layer AD at side surfaces of the first sub-coating layer SCL1 and the second sub-coating layer SCL2, respectively.

Figure 12:
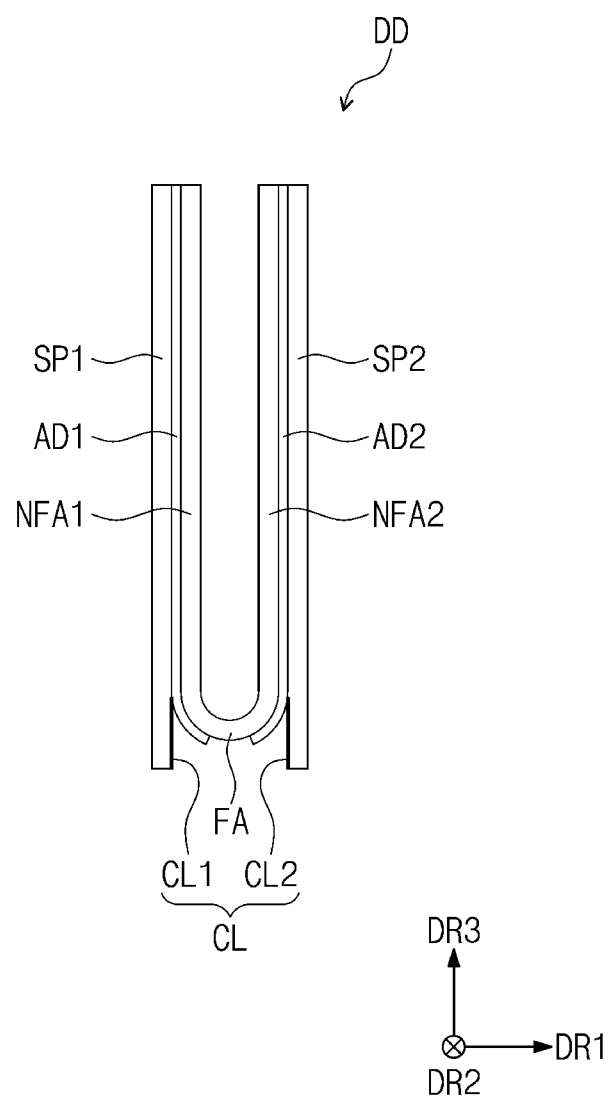
FIG. 12 is a cross-sectional view of the display device shown in FIG. 10, which is folded.

FIG. 12 is a cross-sectional view of the display device DD shown in FIG. 10, which is folded. The directional references in FIG. 10 are maintained in FIG. 12 for convenience of illustration.

Referring to FIG. 12, when the display device DD is folded at the folding area FA thereof, the display device DD may be folded to allow the first non-folding area NFA1 and the second non-folding area NFA2 to face each other. The display device DD shown in FIG. 12 which is folded, may be substantially the same as the display device DD shown in FIG. 2 which is folded. The first and second non-folding areas NFA1 and NFA2 may be supported by the first and second supporters SP1 and SP2, respectively, to be maintained flat.

The portions of the first and second supporters SP1 and SP2, which overlap with the folding area FA, may not be attached to the first and second adhesives AD1 and AD2 due to the first and second coating layers CL1 and CL2 being detachable from the first and second adhesives AD1 and SD2. Accordingly, when the display module DM is folded, the portions of the first and second supporters SP1 and SP2, which are disposed in the folding area FA, may be separated together with the coating layer CL, from the display module DM. In other words, the display device DD which is folded at the folding area FA, disposes in the folding area FA, both the first supporter SP1 and the second supporter SP2 detached from a portion of the first adhesive AD1 which is in the folding area FA and from a portion of the second adhesive AD2 which is in the folding area FA, respectively. At the same time, the display module DM is attached to both the portion of the first adhesive AD1 and the portion of the second adhesive AD2 which are in the folding area FA.

Since the display module DM is flexible display module, the folding area FA may be relatively easily folded. However, the first and second supporters SP1 and SP2 may not be folded since they are relatively rigid and remain flat even when the display device DD is folded, as shown in FIG. 12. In a conventional display device where portions of the first and second supporters SP1 and SP2, which overlap with the folding area FA, are attached to the folding area FA and not detachable therefrom. Consequently, the folding area FA may not be folded due to the first and second supporters SP1 and SP2 being relatively rigid, and thus a folding operation of the display module DM may be difficult.

In one or more embodiment, since the portions of the first and second supporters SP1 and SP2, which overlap with the folding area FA, are not detachable from the display module DM in folding thereof, the folding area FA may be relatively easily folded.

Figure 13:
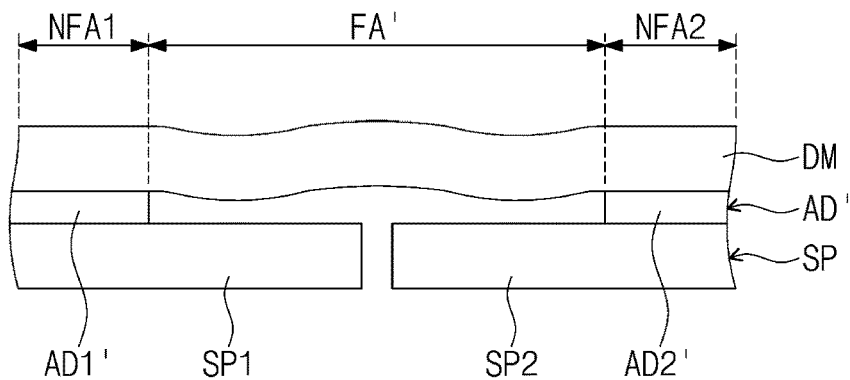
FIGS. 13 and 14 are cross-sectional views of conventional adhesive layers of a display device.
Figure 13:
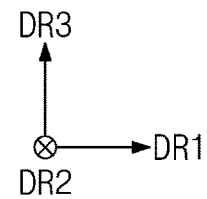
Figure 14:
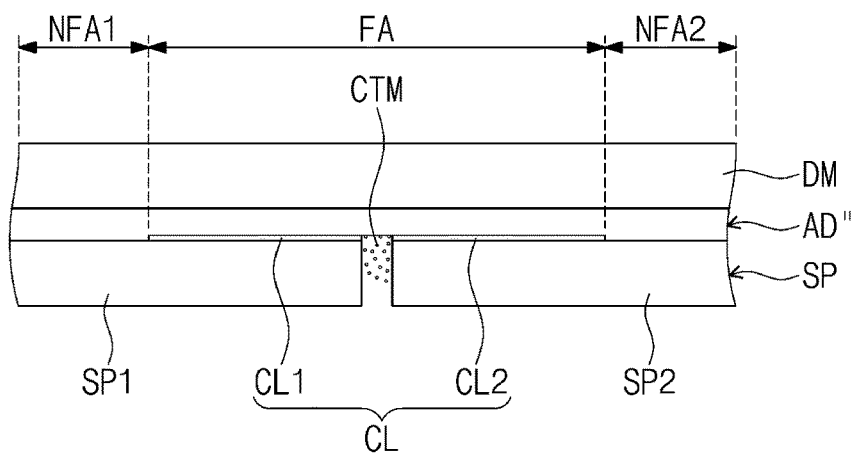
Figure 14:
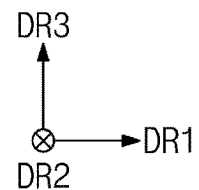

FIGS. 13 and 14 are cross-sectional views of conventional adhesive layers in a display device. FIGS. 13 and 14 are enlarged cross-sectional views corresponding to the view of the embodiments in FIG. 11.

Referring to FIG. 13, first and second adhesives AD1' and AD2' may be disposed only in first and second non-folding areas NFA1 and NFA2, and may not be disposed in a folding area FA'. Where an adhesive layer AD' is disposed in the folding area FA', and first and second supporters SP1 and SP2 are attached to the folding area FA', folding of the display module DM may be difficult as describe above. Therefore, the adhesive layer AD' may not be disposed in the folding area FA' as shown in FIG. 13, to allow folding of the display module DM to be relatively easy. In FIG. 13, the above-described coating layer CL may not be used.

Further referring to FIG. 13, an empty space may be defined between the folding area FA' of the display module DM, and a supporter SP, so that the folding area FA' may not be supported. Since the folding area FA' is not supported by the supporter SP, the folding area FA' may be stretched and deformed when the folding of the display module DM is repeatedly performed, and the deformed folding area FA' may be perceived by the user.

For instance, a portion of the folding area FA', which is adjacent to a boundary between the folding area FA' and the first non-folding area NFA1, may be sagged downward since there is no support by the supporter SP, and a portion of the folding area FA', which is adjacent to a boundary between the folding area FA' and the second non-folding area NFA2, may be also sagged downward since there is no support provided by the supporter SP.

Referring to FIG. 14, an adhesive layer AD" may be disposed throughout the folding area FA as being extended from the first and second non-folding areas NFA1 and NFA2. First and second coating layers CL1 and CL2 may be disposed on first and second supporters SP1 and SP2, respectively, that overlap with a folding area FA. Since the first and second coating layers CL1 and CL2 are spaced apart from each other, a portion of the adhesive layer AD" is exposed to outside the supporter SP. Foreign contaminant particles CTM may be attached to the adhesive layer AD" that overlaps with a space between the first supporter SP1 and the second supporter SP2 and is exposed at the space. When the contaminant particles CTM are attached to the adhesive layer AD", the contaminant particles CTM may be undesirably perceived by the user.

Figure 15:
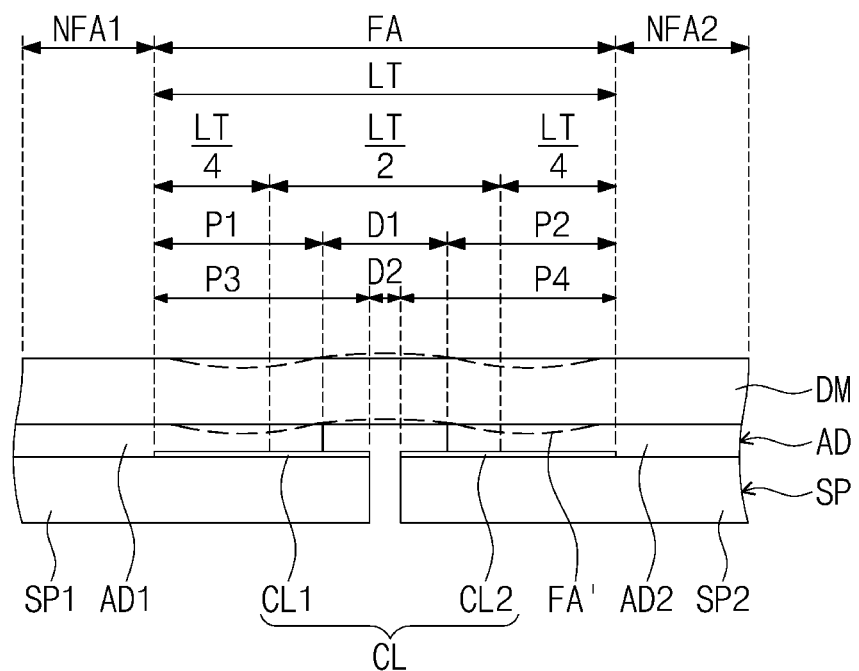
FIG. 15 is a cross-sectional view explaining an embodiment of a method of determining arrangement areas of first and second adhesives shown in FIG. 11.

FIG. 15 is a cross-sectional view explaining an embodiment of a method of determining arrangement areas of the first and second adhesives AD1 and AD2 shown in FIG. 11.

For the convenience of explanation, the deformed folding area FA' described with reference to FIG. 13 is shown as a dotted line in FIG. 15.

Referring to FIG. 15, the first and second adhesives AD1 and AD2 support at least a portion of the deformed folding area FA', which is sagged furthest downward, thereby supporting portions of the folding area FA', which are furthest sagged downward. Accordingly, a distance D1 between the first and second adhesives AD1 and AD2 may be set smaller than a half (LT/2) of a length LT of the folding area FA and may be set greater than a second distance D2.

In detail, a length of each of a first portion P1 and a second portion P2 may be set greater than ¼ (LT/4) of the length LT of the folding area FA and may be set smaller than a length of each of a third portion P3 and a fourth portion P4. The portions of the folding area FA', which are sagged furthest downward, may be attached to the first and second adhesives AD1 and AD2 and may be supported by the first and second supporters SP1 and SP2. Thus, the deformation of the folding area FA (refer to folding area FA') may be reduced or effectively prevented.

In addition, the first and second adhesives AD1 and AD2 are not disposed corresponding to the space between the first supporter SP1 and the second supporter SP2. Accordingly, attachment of the external contaminant particles CTM to the adhesive layer AD' that is exposed at the space between the first supporter SP1 and the second supporter SP2 described with reference to FIG. 14 may be reduced or effectively prevented.

Figure 16:
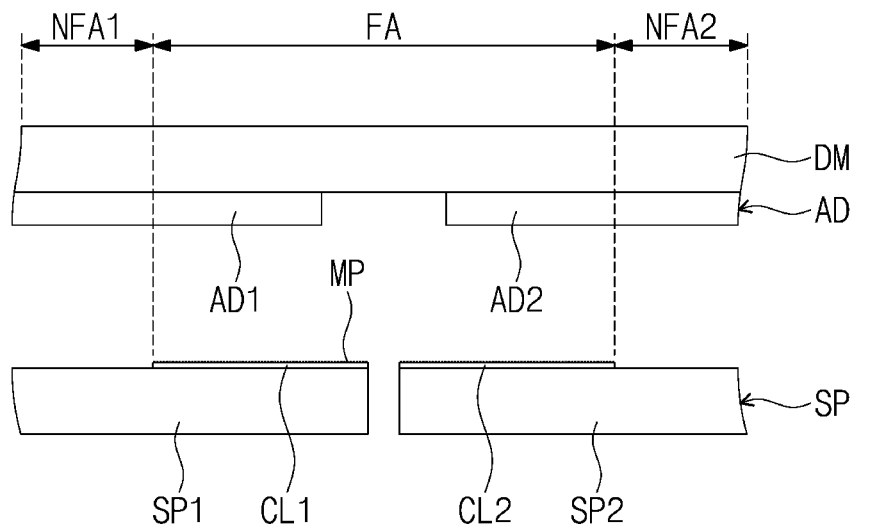
FIGS. 16 to 18 are cross-sectional views in an embodiment of a manufacturing process of the display device shown in FIG. 11.
Figure 16:
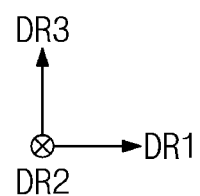
Figure 17:
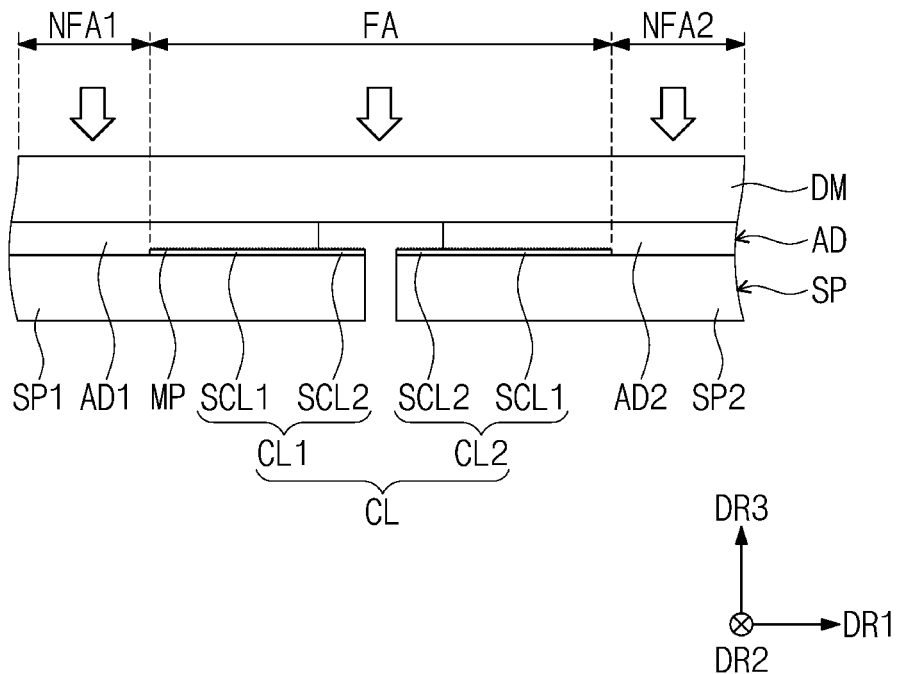
Figure 18:
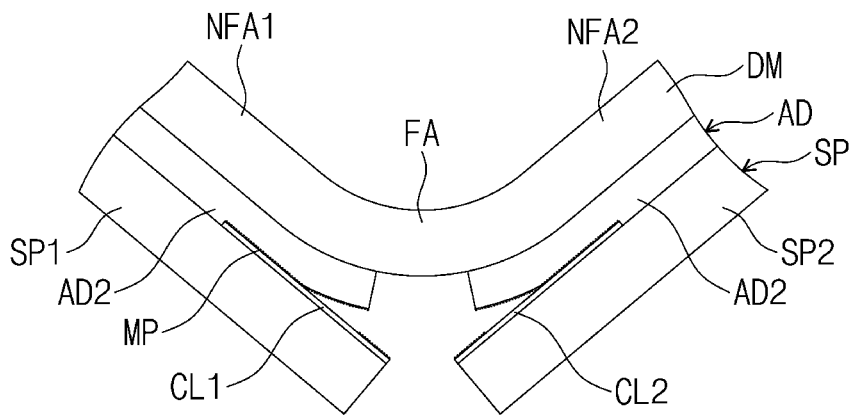

FIGS. 16 to 18 are cross-sectional views of an embodiment of a manufacturing process of the display device shown in FIG. 11.

Referring to FIG. 16, the first and second coating layers CL1 and CL2 may be respectively provided on the upper surfaces of the first and second supporters SP1 and SP2, which overlap with the folding area FA, respectively. A plurality of particles MP in the form of powder may be disposed on the first and second coating layers CL1 and CL2. The particles MP may include metal particles. The display module DM to which the first and second adhesives AD1 and AD2 are attached may be disposed above the first and second supporters SP1 and SP2, respectively.

Referring to FIG. 17, the display module DM to which the first and second adhesives AD1 and AD2 are attached may be pressed to the first and second supporters SP1 and SP2, respectively. The first and second supporters SP1 and SP2 may be attached to the first and second adhesives AD1 and AD2.

The particles MP disposed on the first sub-coating layers SCL1 may be attached to the first and second adhesives AD1 and AD2. Since the particles MP are attached to the first and second adhesives AD1 and AD2, the first sub-coating layers SCL1 may not be attached to the first and second adhesives AD1 and AD2. That is, the first sub-coating layers SCL1 may be detachable from the first and second adhesives AD1 and AD2, respectively, at the particles MP. The particles MP disposed on the second sub-coating layers SCL2 may remain on the second sub-coating layers SCL2. The second sub-coating layers SCL2 and the first and second supporters SP1 and SP2, may each extend further than end surfaces of the first and second adhesives AD1 and AD2, at a space therebetween along the first direction DR1, respectively. The space between the first supporter SP1 and the second supporter SP2 is aligned with the space between the first and second adhesives AD1 and AD2.

Referring to FIG. 18, since the first and second coating layers CL1 and CL2 are not attached to the first and second adhesives AD1 and AD2 at the first and second sub-coating layers SCL1 and SCL2, the portions of the first and second supporters SP1 and SP2 which overlap with the folding area FA, may be separated from the first and second adhesives AD1 and AD2 when the display module DM is folded. Accordingly, a folding operation of the display device DD and the display module DM thereof may be relatively easily carried out.

That is, the display module DM in FIG. 18, which is folded, disposes the first and second supporters SP1 and SP2 together with the coating layer CL, separated from the display module DM to which the adhesive layer AD is attached. More particularly, the display device DD which is folded at the folding area FA disposes, at the folding area FA and at the same time, the particles MP attached to the first adhesive AD1 and the second adhesive AD2, and the coating layer CL together with the first supporter SP1 and the second supporter SP2, detached from each of the particles MP, the first adhesive AD1, the second adhesive AD2 and the display module DM.

Although embodiments of the invention have been described, it is understood that the invention should not be limited to these embodiments but various changes and modifications can be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. A display device comprising:
   a display module comprising a first non-folding area, a second non-folding area, and a folding area between the first and second non-folding areas, the first non-folding area, the second non-folding area, and the folding area being arranged in a first direction;
   a first supporter under the first non-folding area;
   a second supporter under the second non-folding area;
   a first adhesive between the first non-folding area and the first supporter; and
   a second adhesive between the second non-folding area and the second supporter,
   wherein a first distance along the first direction between the first adhesive and the second adhesive is greater than a second distance along the first direction between the first supporter and the second supporter, and smaller than a length of the folding area along the first direction.

2. The display device of claim 1, wherein the first distance is smaller than half the length of the folding area.

3. The display device of claim 1, wherein
   the first adhesive is in both the first non-folding area and the folding area, and
   the second adhesive is in both the second non-folding area and the folding area.

4. The display device of claim 3, wherein
   the first supporter is in both the first non-folding area and the folding area, and
   the second supporter is in both the second non-folding area and the folding area.

5. The display device of claim 4, wherein a planar area of each of the first and second supporters, within the folding area, is greater than a planar area of each of the first and second adhesives, within the folding area.

6. The display device of claim 4, wherein within the folding area, a length of the first adhesive which is taken along the first direction is equal to a length of the second adhesive which is taken along the first direction.

7. The display device of claim 4, wherein within the folding area, a length of the first supporter which is taken along the first direction is equal to a length of the second supporter which is taken along the first direction.

8. The display device of claim 4, wherein within the folding area, a length of the first adhesive which is taken along the first direction and a length of the second adhesive which is taken along the first direction, are both smaller than each of a length of the first supporter which is taken along the first direction and a length of the second supporter which is taken along the first direction.

9. The display device of claim 8, wherein within the folding area, the length of the first adhesive and the length of the second adhesive are each greater than ¼ the length of the folding area.

10. The display device of claim 4, wherein within the folding area,
    a length of the first adhesive which is taken along the first direction is different from a length of the second adhesive which is taken along the first direction, and
    a length of the first supporter which is taken along the first direction is different from a length of the second supporter which is taken along the first direction.

11. The display device of claim 1, further comprising a coating layer coated on an upper surface of each of the first and second supporters overlapping with the folding area.

12. The display device of claim 11, wherein the coating layer comprises fluorine.

13. The display device of claim 11, further comprising a plurality of particles between the coating layer and each of the first adhesive and the second adhesive, respectively.

14. The display device of claim 13, wherein particles disposed on a portion of the coating layer overlapping with each of the first and second adhesives among the particles are attached to the first and second adhesives.

15. A display device comprising:
    a display module comprising a folding area;
    a first supporter and a second supporter, which are disposed under the display module and arranged in a first direction;
    a first adhesive between the display module and the first supporter, in the folding area;
    a second adhesive between the display module and the second supporter, in the folding area;
    a first coating layer and a second coating layer respectively on an upper surface of each of the first and second supporters overlapping with the folding area;
    a side surface of the first coating layer and a side surface of the second coating layer facing each other and spaced apart from each other along the first direction; and
    a side surface of the first adhesive and a side surface of the second adhesive facing each other and spaced apart in the first direction from a side surface of the first supporter and a side surface of the second supporter facing each other so as not to overlap the side surfaces of the first and second supporters, wherein the side surface of the first adhesive and the side surface of the second adhesive do not overlap the side surface of the first coating layer and the side surface of the second coating layer.

16. The display device of claim 15, wherein the display device which is unfolded further includes within the folding area, the length of the first adhesive from the side surface thereof equal to the length of the second adhesive from the side surface thereof, and the length of the first supporter from the side surface thereof equal to the length of the second supporter from the side surface thereof.

17. The display device of claim 16, wherein within the folding area, the lengths of each of the first adhesive and the second adhesive is greater than ¼ of a length of the folding area which is taken along the first direction.

18. The display device of claim 15, wherein the display device which is unfolded further includes within the folding area, the length of the first adhesive from the side surface thereof different from the length of the second adhesive from the side surface thereof, and the length of the first supporter from the side surface thereof different from the length of the second supporter from the side surface thereof.

19. A display device comprising:

a display module comprising a folding area;

a first supporter and a second supporter, which are disposed under the display module and arranged in a first direction;

a first adhesive between the display module and the first supporter, in the folding area;

a second adhesive between the display module and the second supporter, in the folding area;

a coating layer coated on an upper surface of each of the first and second supporters overlapping with the folding area; and a plurality of particles disposed on the coating layer, wherein a first distance along the first direction, between the first adhesive and the second adhesive is greater than a second distance along the first direction, between the first supporter and the second supporter, and smaller than a length of the folding area, and the particles disposed on a portion of the coating layer overlapping with each of the first and second adhesives among the particles are attached to the first and second adhesives.

* * * * *